(12) United States Patent
Zhang et al.

(10) Patent No.: US 6,391,220 B1
(45) Date of Patent: May 21, 2002

(54) METHODS FOR FABRICATING FLEXIBLE CIRCUIT STRUCTURES

(75) Inventors: Lei Zhang, San Jose; Solomon Beilin, San Carlos; Som S. Swamy, Danville; James J. Roman, Sunnyvale, all of CA (US)

(73) Assignee: Fujitsu Limited, Inc. (JP)

( * ) Notice: Subject to any disclaimer, the term of this patent is extended or adjusted under 35 U.S.C. 154(b) by 0 days.

(21) Appl. No.: 09/376,645

(22) Filed: Aug. 18, 1999

(51) Int. Cl.$^7$ ............................................. B32B 31/00
(52) U.S. Cl. .................... 216/67; 438/694; 438/706; 438/957; 438/968; 438/976; 29/846; 29/849; 156/247; 156/248; 156/273.9
(58) Field of Search .................... 216/40, 58, 67; 438/694, 706, 957, 968, 976; 29/846, 849; 156/246, 247, 248, 272.8, 273.5, 273.9

(56) References Cited

U.S. PATENT DOCUMENTS

| | | | |
|---|---|---|---|
| 4,480,288 A | 10/1984 | Gazdik et al. | 361/398 |
| 4,499,152 A | 2/1985 | Green et al. | 428/448 |
| 4,517,051 A | 5/1985 | Gadzik et al. | 156/644 |
| 4,604,160 A | * 8/1986 | Murakami et al. | 156/630 |
| 4,650,545 A | 3/1987 | Laakso et al. | 156/655 |
| 4,711,791 A | 12/1987 | Wiseman et al. | 427/96 |
| 4,790,902 A | * 12/1988 | Wada et al. | 156/630 |
| 4,812,191 A | 3/1989 | Ho et al. | 156/239 |
| 4,915,983 A | * 4/1990 | Lake et al. | 427/98 |
| 4,995,941 A | 2/1991 | Nelson et al. | 156/630 |
| 5,268,065 A | 12/1993 | Grupen-Shemanski | 156/630 |
| 5,534,094 A | 7/1996 | Arjavalingam | 156/155 |
| 5,614,277 A | 3/1997 | Beilstein, Jr. et al. | 428/40.1 |
| 5,653,019 A | 8/1997 | Berhardt et al. | 29/840 |
| 5,720,099 A | 2/1998 | Parker et al. | 29/825 |
| 5,721,007 A | 2/1998 | Lynch et al. | 427/98 |
| 5,759,417 A | 6/1998 | Inaba | 216/18 |
| 5,779,870 A | 7/1998 | Seip | 205/77 |
| 5,798,050 A | 8/1998 | Gaynes et al. | 216/20 |
| 5,822,856 A | 10/1998 | Bhatt et al. | 29/832 |
| 5,914,165 A | 6/1999 | Freedman | 428/40.1 |
| 5,937,512 A | 8/1999 | Lake et al. | 29/832 |

FOREIGN PATENT DOCUMENTS

JP 63-244796 12/1988 ............ H05K/3/46

OTHER PUBLICATIONS

Fach et al., "High–flexible Multilayer Substrates with 30 μm Vias for Highest Connection and Packaging Density," FLEXCON™ '97, 1997 Semiconductor Technology Center, Inc., pps. 111–116.

* cited by examiner

Primary Examiner—Randy Gulakowski
Assistant Examiner—Jiri Smetana
(74) Attorney, Agent, or Firm—Coudert Brothers LLP

(57) ABSTRACT

Methods and articles used to fabricate flexible circuit structures are disclosed. The methods include depositing a release layer on substrate, and then forming a conductive laminate on the release layer. After the release layer is formed, the conductive laminate can be easily separated by the substrate to eventually form a flexible circuit structure.

30 Claims, 2 Drawing Sheets

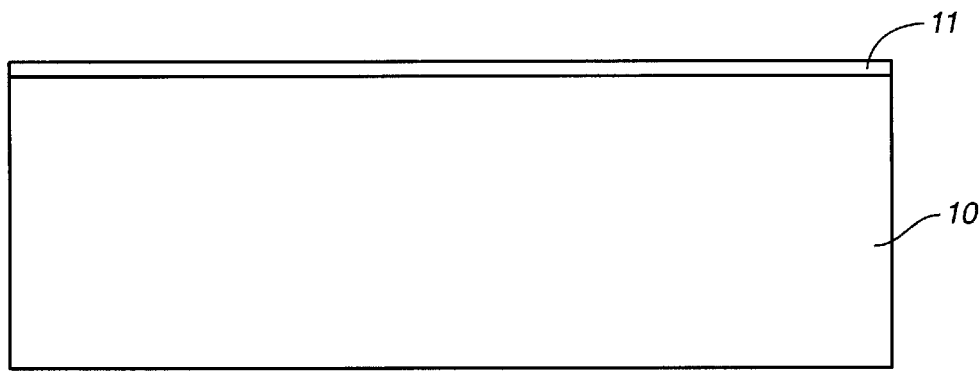
FIG._1
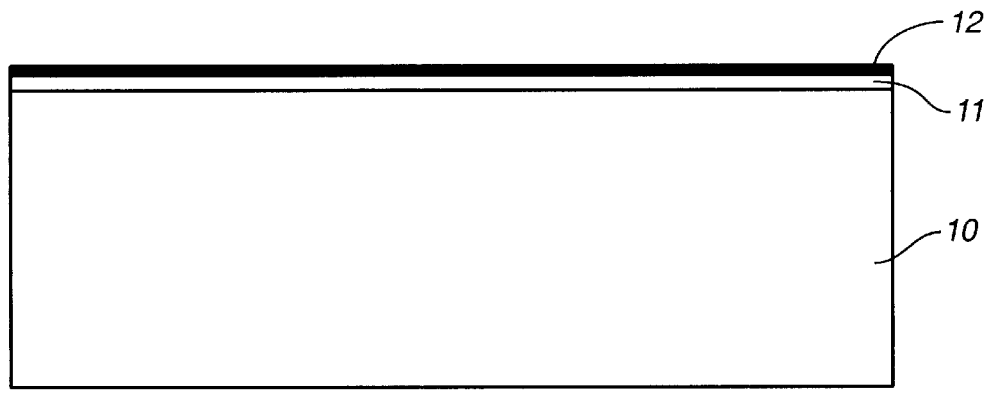
FIG._2
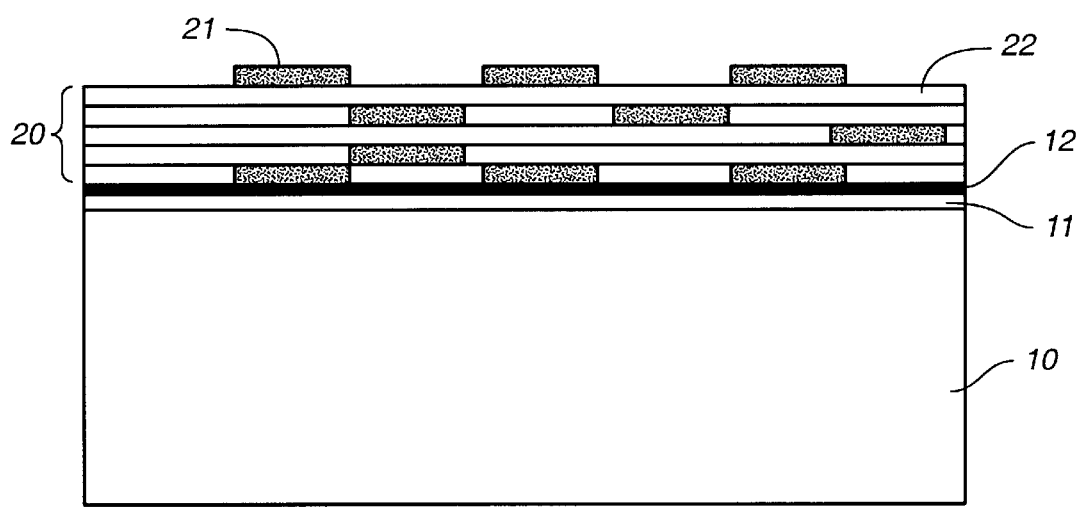
FIG._3

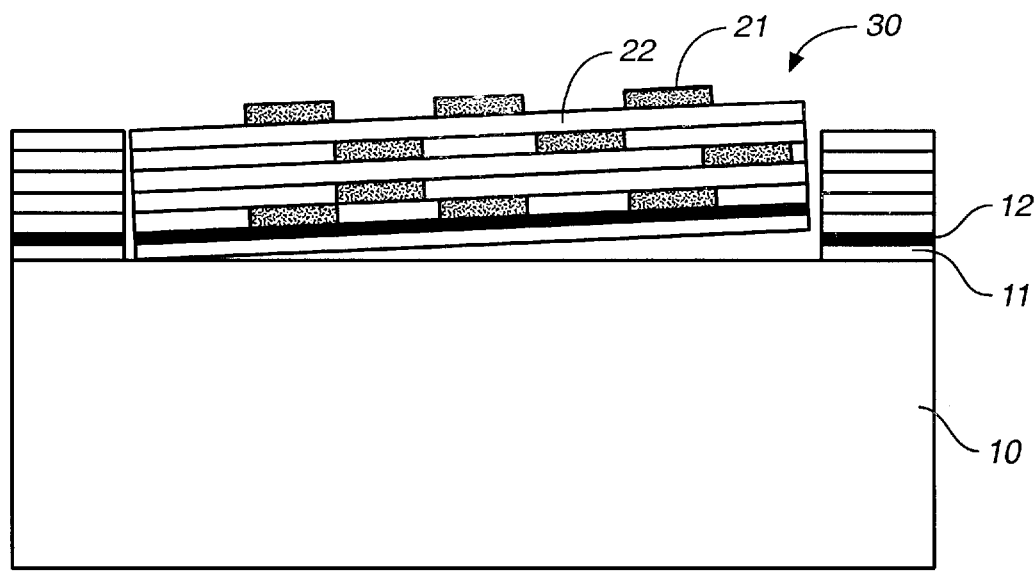
FIG._4
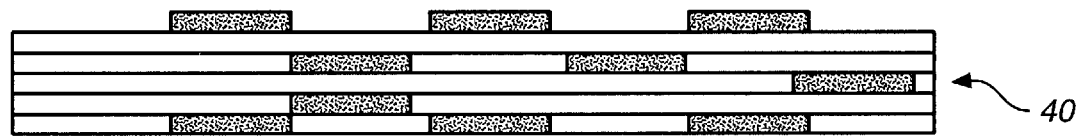
FIG._5

METHODS FOR FABRICATING FLEXIBLE CIRCUIT STRUCTURES

FIELD OF THE INVENTION

Embodiments of the invention relate to methods and precursors used for forming flexible circuit structures.

BACKGROUND OF THE INVENTION

Circuit structures such as circuit boards have conductive lines which are used to communicate electrical components such as integrated circuit chips. Flexible circuit structures have been of particular interest in recent years, because flexible circuit structures have many advantages over rigid circuit structures. For example, flexible circuit structures typically weigh less and can occupy less space than rigid circuit structures. The reduced space and weight provided by flexible circuit structures make them especially suitable for use in lightweight and small products such as laptop computers, cellular phones, cameras, etc.

While flexible circuit structures are highly desirable, reliable flexible circuit structures having fine line circuit patterns can be difficult to form in an efficient and cost-effective manner. For example, typical flexible circuit structure precursors typically include one or more flexible dielectric films with one or more conductive patterns on the dielectric films. Forming conductive patterns on flexible dielectric films is difficult, because they are flimsy and thin. If, for example, a flexible dielectric film wrinkles during a photolithography process, a formed photoresist image on the dielectric film may be distorted. This distortion can lead to the formation of short and/or open circuits in the subsequently formed conductive pattern.

It would be desirable to provide for improved articles and methods for fabricating flexible circuit structures.

SUMMARY OF THE INVENTION

Embodiments of the invention can be used to manufacture flexible circuit structures efficiently and less expensively.

One embodiment of the invention is directed to a method comprising: depositing a release layer on a substrate; forming a conductive laminate on the release layer; and peeling at least a portion of the conductive laminate off of the substrate.

Another embodiment of the invention is directed to a method comprising: depositing a release layer on a substrate; forming a flexible conductive laminate on the release layer; cutting the conductive laminate along a line defining a portion of the conductive laminate; and separating the cut portion of the conductive laminate from the substrate.

Another embodiment of the invention is directed to an article comprising: a substrate; a conductive laminate; and a release layer disposed between the substrate and the conductive laminate, wherein the conductive laminate is flexible and is capable of being peeled off of the substrate.

These and other embodiments of the invention are described in further detail below.

BRIEF DESCRIPTION OF THE DRAWINGS

FIGS. 1 to 5 show cross sections of articles used in the formation of flexible circuit structures.

DETAILED DESCRIPTION

In embodiments of the invention, a release layer is deposited on a substrate. During processing, the substrate supports flexible layers used to form a conductive laminate, which is in turn used to form a flexible circuit structure. After the conductive laminate is formed on the release layer and the substrate, at least a portion of the conductive laminate is separated from the substrate. For example, the conductive laminate or a portion of the conductive laminate is separated from the substrate by peeling it off of the substrate. In some embodiments, at least a portion of the release layer is separated along with the separated conductive laminate portion. If desired, the release layer material on the separated conductive laminate portion can be removed from the conductive laminate portion to form the flexible circuit structure.

The substrate is suitable for supporting one or more flexible conductive and dielectric layers when forming a conductive laminate. Preferably, the substrate has a major surface, which is smooth. Examples of typical substrates include plates, wafers, and disks. Typical substrates may include any suitable material including a rigid ceramic, polymeric, or metallic material. Suitable substrate materials include aluminum nitride, silicon, quartz, glass, and aluminum. Moreover, the substrate can be a monolithic body or can be a composite having two or more layers. For example, the substrate can comprise a wafer (e.g., a ceramic wafer) having a thin layer of metal (e.g., aluminum) or oxide (e.g., silica) on the wafer. In other embodiments, the substrate can comprise a monolithic body such as a metal plate or a metal wafer. The substrate is also preferably capable of being easily transported to one or more processing tools.

With reference to FIG. 1, the release layer 11 is deposited on a substrate 10 in any suitable manner. For example, the release layer 11 can be coated or laminated on the substrate 10. Suitable coating processes include spin coating, dip coating, curtain coating, doctor blade coating, and roller coating. The deposited release layer 11 can have any suitable thickness including a thickness of less than about 10 microns. The thickness of the release layer 11 is preferably between about 2 and about 10 microns.

The release layer 11 is disposed between the conductive laminate 20 and the substrate 10. The release layer 11 is preferably in direct contact with the substrate 10 and facilitates easy separation of the conductive laminate 20 from the substrate 10. For example, in some embodiments, a portion of the conductive laminate can be peeled off of the substrate 10 (e.g., by hand) without damaging the separated conductive laminate portion. In this regard, the release layer 11 preferably has a shear strength such that it does not tear or leave a portion on the conductive laminate 20 or on the substrate 10 when peeling takes place.

The peelable interface can be present at either surface of the release layer 11. For example, the peelable interface can be between the release layer 11 and the substrate 10. During peeling, a portion of the release layer 11 can be simultaneously peeled off of the substrate 10 along with the peeled conductive laminate. In another example, the peelable interface can be between the release layer 11, and a barrier layer or conductive laminate in direct contact with the release layer 11. In these embodiments, the release layer 11 can remain on the substrate 10 after the conductive laminate 20 is peeled off of the substrate 10. The peel strength between the release layer 11 and another structure (e.g., the substrate 10) in direct contact with the release layer 11 may be less than about 30 g/cm (e.g, at 90°).

The peel strength can be modified by modifying the properties of the release layer. For example, in some embodiments, the adhesive properties of the release layer 11 can be modified by introducing the release layer 11 to a humid environment. For example, a polyimide release layer disposed on a glass substrate may be exposed to an environment having a humidity of greater than about 80%. After curing, for example, a polyimide/glass substrate combination can be put in a high-humidity, high-pressure chamber for about 30 minutes or more. It is believed that the absorption of water into the release layer can reduce the adhesion between the glass substrate and the polyimide release layer so that the subsequent separation of the conductive laminate from the substrate is less difficult. In other embodiments, the properties of the deposited and cured release layer need not be modified. For instance, polyimide release layers on quartz substrates typically need not be modified as polyimide release layers are normally easily peelable from quartz substrates.

The release layer 11 can include any suitable material. For example, the release layer 11 may include a polymeric material. Suitable examples of polymeric materials include polyimides (e.g., DuPont PI 2611), fluoropolymers such as fluorinated poly(arylethers), benzocyclobutenes (e.g, Cyclotene™ from Dow Chemical), polyphenylquinoxalines (PPQ), polynorborenes (e.g., Avatrel™ from BF Goodrich), liquid crystal polymers, and silicon containing polymers such as polysiloxanes.

After the release layer 11 is deposited on the substrate 10, the release layer 11 may be cured. Any suitable curing temperature may be used. For example, the deposited release layer 11 may be heated to a temperature of at least about 300° C. to cure the release layer. Preferred curing temperatures can be between about 350° C. to about 375° C. Curing or heating the release layer can be desirable if, for example, the deposited release layer 11 needs to be further solidified after being deposited on the substrate 10.

In some embodiments, a bonding material (not shown) such as an adhesive or coupling agent (e.g., a silane coupling agent) can be deposited on the substrate 10 prior to depositing the release layer 11 on the substrate 10. The bonding material can be applied in a predetermined configuration on the substrate so that the portions of the release layer 11 contacted by the bonding material are tightly bonded to the surface of the substrate 10. The tightly bonded portions of the release layer may serve as a frame to hold the less tightly bonded regions of the release layer against the substrate surface. By using a bonding material to secure the release layer 11 to the substrate 10, a wider variety of substrate and release layer materials can be used to form flexible printed circuit structures.

In an illustrative method using the bonding material, the bonding material is applied to the substrate surface in a pattern generally corresponding to the regions of the conductive laminate to be cut. For example, the peripheral regions of the substrate surface can be coated with a continuous or discontinuous line of bonding material prior to depositing the release layer 11. After depositing the release layer 11, the release layer 11 contacts the bonding material and is tightly secured to the peripheral regions of the substrate 10 via the bonding material. As the conductive laminate 20 is adhered to the release layer (e.g., via a barrier layer), the subsequently formed conductive laminate 20 is also tightly secured to the peripheral regions of the substrate 10. Portions of the release layer 11 and the conductive laminate 20 disposed inwardly from the peripheral regions can be less tightly secured (e.g., unsecured) to the surface of the substrate 10. After the conductive laminate 20 is formed on, and is adhered to, the release layer 11, the conductive laminate 20 can be cut at regions inwardly from and proximate to the tightly secured regions of the release layer 11. The less tightly secured, cut conductive laminate portion can then be physically detached from the portions of the conductive laminate which are tightly secured to the substrate, and then separated from the substrate 10 (e.g., by peeling).

With reference to FIG. 2, a barrier layer 12 can be optionally deposited on the release layer 11 and substrate 10, after the release layer 11 is deposited on the substrate 10. As shown in FIG. 2, the release layer 11 is disposed between, and may be in direct contact with, both the substrate 10 and the barrier layer 12. Preferably, the barrier layer 12 is a continuous layer which is substantially coextensive with the adjacent release layer 11. The barrier layer can be used to help adhere the conductive laminate to the release layer and/or can be used as a seed layer to initiate the formation a subsequently formed conductive laminate 20.

As will be described in further detail below, the barrier layer 12 can also be used to protect the separated conductive laminate or portion thereof during the removal of any release layer material attached it. After any attached release layer material is removed, the barrier layer 12 can remain as part of the subsequently formed flexible circuit structure or may be removed (e.g., by etching). Alternatively, if the barrier layer 12 is conductive, a conductive pattern may be formed from the barrier layer 12 (e.g., by using photolithography), and can constitute part of the flexible circuit structure. In such embodiments, circuit patterns can be formed on both sides of a flexible circuit structure in an efficient manner.

The barrier layer 12 can be deposited on the release layer 11 in any suitable manner. For example, the barrier layer 12 can be laminated to the release layer 11. Alternatively, a barrier layer material can be coated on the release layer 11 by a coating process such as sputtering or vapor deposition. The deposited barrier layer 12 can have any suitable thickness including a thickness of about 300 angstroms (e.g., 400 angstroms) or more. While the barrier layer 12 may comprise any suitable material, the barrier layer 12 preferably comprises a metal such as Cr, Cu, Ag, Au, etc. The barrier layer may be in the form of a single layer or can be comprised of multiple sublayers. In some embodiments, one sublayer can be used as an adhesion layer and another sublayer can be used as a seed layer. For example, the barrier layer may include an adhesion sublayer of chromium (e.g., at least about 400 angstroms thick) and a seed sublayer of copper (e.g., at least about 4000 angstroms thick).

While the embodiments described with reference to FIGS. 1 to 5 describe the use of a barrier layer between the release layer 11 and the conductive laminate 20, the barrier layer 12 need not be used. For example, in some embodiments, the conductive laminate 20 may be formed directly on the release layer 11 and portions of the conductive laminate 20 may be separated from the substrate 10 to form a flexible circuit structure. These embodiments can be used to form a flexible circuit structure having a conductive pattern on one side.

With reference to FIG. 3, after depositing the release layer 11 or the barrier layer 12, a conductive laminate 20 is formed on the release layer 11. The conductive laminate 20 typically includes one or more flexible dielectric layers and one or more patterned conductive layers. Any suitable process including additive, subtractive, or semi-additive processes can be used to form the conductive laminate 20. Preferably, the conductive patterns in the conductive laminate 20 are formed by electroplating, and the dielectric layers are formed by coating (e.g., spin coating) and then curing a dielectric material (e.g., polyimide). If electroplating is used, the barrier layer 12 or a portion thereof can be used as a seed layer for a subsequent build up of conductive structures such as conductive via structures in the conductive laminate 20. The conductive and insulating layers in the conductive laminate 20 typically have a thickness of about 25 microns or less.

After forming the conductive laminate 20, the conductive laminate 20 can be cut so that the cut portion of the conductive laminate 20 can be separated from the substrate 10. The conductive laminate 20, the release layer 11 and the barrier layer 12 can be cut by using any suitable process. For example, one or more of these layers or structures can be cut with a laser or a blade such as a saw, knife or razor blade. In other embodiments, the conductive laminate 20 need not be cut. For example, the conductive laminate 20 can be peeled off of the substrate 10 without cutting the conductive laminate 20.

The conductive laminate 20 can be cut along lines which define the predetermined conductive laminate portions to be removed. The release layer 11 and, if present, the barrier layer 12, can be cut along with the conductive laminate 20. For example, as shown in FIG. 4, the conductive laminate 20, the release layer 11, and the barrier layer 12 can be cut at a region inwardly from the periphery of the substrate 10 so that a corresponding conductive laminate portion 20 can be separated. In some embodiments, the conductive laminate 20 may be cut according to a pattern which corresponds to portions of the conductive laminate to be peeled. In these embodiments, plural distinct conductive laminate portions are formed. For example, the conductive laminate 20 may comprise an array of flexible circuit structures. The conductive laminate 20, the release layer 11, and the barrier layer 12 can be diced or cut along lines separating individual flexible circuit structures in the array so that the individual circuit structures can be separated from each other and from the substrate 10.

After cutting the conductive laminate 20, the cut conductive laminate portion 30 is separated from the substrate 10. Preferably, the cut conductive laminate portions 30 are separated from the substrate 10 by peeling. As shown in FIG. 4, co-extensive cut portions of the conductive laminate 20, the barrier layer 12, and the release layer 11 can be simultaneously peeled off of the substrate 10. The cut conductive laminate portion 30 can be peeled by hand or with any suitable apparatus.

After separating the conductive laminate portion 30 from the substrate 10, the release layer material separated along with the conductive laminate portion can be removed. Release layer material attached to the conductive laminate portion 30 can be removed using any suitable process. For example, the release layer material can be removed by an etching process such as plasma etching or wet chemical etching. Preferably, the release layer material is removed by plasma etching. In a typical plasma etching process, the reaction chamber pressure can be about 150 to 300 mT, the ionizable gas flow rate (e.g., oxygen) can be about 50 to 150 sccm (standard cubic centimeters), and the power can be about 200 to 450 Watts.

During the removal of the release layer material, the barrier layer 12 can be used to protect the conductive laminate portion 30. For example, the barrier layer material can be resistant to a medium used for etching the release layer material. When the release layer material on the conductive laminate portion 30 is being etched, the barrier layer 12 covers the conductive laminate portion, thus protecting it from the etching medium. Consequently, the release layer material can be removed, without etching the conductive laminate portion.

After the release layer material is removed, the barrier layer portion removed along with the release layer can remain on the conductive laminate portion 30 or can be removed from the conductive laminate portion 30. Any suitable process including etching can be used to remove the barrier layer material. In other embodiments, the barrier layer or portion thereof can be patterned. Any suitable process including photolithography and laser ablation can be used to form a conductive pattern from the barrier layer or barrier layer portion.

The subsequently formed flexible circuit structure 40 can have any suitable dimensions. For example, the formed flexible circuit structure can have a thickness between about 3 and about 100 microns, and preferably between about 10 and about 50 microns. The planar dimensions of the flexible circuit structure can vary depending upon the application intended. For example, the flexible circuit structure can have planar dimensions larger than the planar dimensions of one chip or many coplanar chips so that the chips can be disposed on the flexible circuit structure. In other embodiments, the flexible circuit structures may be used as electrical connectors between, e.g., two circuit boards.

Embodiments of the invention provide for many advantages. For example, because the flexible circuit structure precursors can be separated from the substrate without degrading the substrate, the substrate can be reused. Consequently, less materials are needed to form the flexible circuit structures and processing costs can be reduced. Moreover, in embodiments of the invention, the flexible layers used in forming the circuit structures can be stabilized during processing. After a conductive laminate is formed, it can be easily separated from the supporting substrate (e.g., by peeling). More complicated process such as wet etching or laser ablation are not needed to separate the conductive laminate from the substrate.

The terms and expressions which have been employed herein are used as terms of description and not of limitation, and various modifications to the described embodiments are within the scope of the claimed invention. Moreover, any one or more features of any embodiment of the invention may be combined with any one or more other features of any other embodiment of the invention, without departing from the scope of the invention.

What is claimed is:

1. A method comprising:
   depositing a release layer on a substrate;
   exposing the deposited release layer to a humid environment having a humidity greater than about 80%;
   forming a conductive laminate on the release layer; and
   peeling at least a portion of the conductive laminate off of the substrate.

2. The method of claim 1 further comprising:
   depositing a barrier layer on the release layer prior to forming a conductive laminate on the release layer.

3. The method of claim 2 wherein peeling at least a portion of the conductive laminate off of the substrate comprises simultaneously peeling at least a portion of the conductive laminate, at least a portion of the release layer, and at least a portion of the barrier layer off of the substrate.

4. The method of claim 3 further comprising, after peeling:
   etching the release layer.

5. The method of claim 4 wherein etching comprises plasma etching.

6. The method of claim 5 further comprising, after etching the release layer:
   forming a wiring pattern from the peeled barrier layer portion.
7. The method of claim 2 wherein the barrier layer is in direct contact with the conductive laminate and the release layer.
8. The method of claim 2 wherein the release layer is in direct contact with the barrier layer and the substrate prior to peeling.
9. The method of claim 1 wherein peeling at least a portion of the conductive laminate off of the substrate comprises simultaneously peeling at least a portion of the conductive laminate and at least a portion of the release layer off of the substrate.
10. The method of claim 9 further comprising, after peeling:
    etching the portion of the release layer peeled off of the substrate.
11. The method of claim 1 further comprising depositing a bonding material on the substrate prior to depositing the release layer on the substrate.
12. The method of claim 11 wherein depositing the bonding material comprises depositing the bonding material in a line corresponding to the portion of the conductive laminate to be peeled off of the substrate.
13. The method of claim 1 further comprising, after forming the conductive laminate:
    cutting the conductive laminate in a pattern corresponding to the portion of the conductive laminate to be peeled off of the substrate.
14. The method of claim 13 wherein cutting comprises dicing the conductive laminate.
15. The method of claim 1 wherein said release layer has a peel strength less than about 30 g./cm.
16. The method of claim 1 wherein said release layer is connected to least opposed peripheral regions on said substrate.
17. The method of claim 1 additionally comprising depositing, prior to depositing said release layer on said substrate, a bonding material on opposed peripheral regions of said substrate, leaving a region of the substrate between the opposed peripheral regions with no bonding material.
18. The method of claim 16 wherein said release layer has a peel strength less than about 30 g./cm.
19. The method of claim 17 wherein said release layer is connected to least opposed peripheral regions on said substrate.
20. The method of claim 18 additionally comprising depositing, prior to depositing said release layer on said substrate, a bonding material on opposed peripheral regions of said substrate, leaving a region of the substrate between the opposed peripheral regions with no bonding material.
21. The method of claim 19 additionally comprising depositing, prior to depositing said release layer on said substrate, a bonding material on opposed peripheral regions of said substrate, leaving a region of the substrate between the opposed peripheral regions with no bonding material.
22. A method comprising:
    depositing a release layer on a substrate;
    exposing the deposited release layer to a humid environment having a humidity greater than about 80%;
    forming a flexible conductive laminate on the release layer;
    cutting the conductive laminate along a line defining a portion of the conductive laminate; and
    separating the cut portion of the conductive laminate from the substrate.
23. The method of claim 22 additionally comprising separating at least a portion of the release layer from the substrate.
24. The method of claim 22 wherein said release layer has a peel strength less than about 30 g./cm.
25. The method of claim 22 wherein said release layer is connected to least opposed peripheral regions on said substrate.
26. The method of claim 22 additionally comprising depositing, prior to depositing said release layer on said substrate, a bonding material on opposed peripheral regions of said substrate, leaving a region of the substrate between the opposed peripheral regions with no bonding material.
27. A method comprising:
    depositing a bonding material on opposed peripheral regions of a substrate, leaving a region of the substrate between the opposed peripheral regions with no bonding material;
    depositing a release-layer on the substrate such that the bonding material disposed on the peripheral regions connects the release layer to the peripheral regions, leaving a portion of the release layer between the peripheral regions unconnected to the substrate;
    forming a flexible conductive laminate on the release layer;
    cutting the conductive laminate along a line defining a portion of the conductive laminate; and
    separating the cut portion of the conductive laminate from the substrate.
28. The method of claim 27 wherein cutting the conductive laminate comprises cutting the conductive laminate and the release layer along the line defining a portion of the conductive laminate and the release layer, and wherein separating comprises separating the cut portion of the conductive laminate and the release layer from the substrate.
29. A method comprising:
    depositing a bonding material on opposed peripheral regions of a substrate, leaving a region of the substrate between the opposed peripheral regions with no bonding material;
    depositing a release layer on the substrate such that the bonding material disposed on the peripheral regions connects the release layer to the peripheral regions, leaving a portion of the release layer between the peripheral regions unconnected to the substrate;
    forming a conductive laminate on the release layer; and
    peeling at least a portion of the conductive laminate off of the substrate.
30. The method of claim 29 additionally comprising severing the release layer between the peripheral regions, and removing from the substrate the unconnected portion of the release layer.

* * * * *